(12) United States Patent
Kerkman et al.

(10) Patent No.: US 8,575,915 B2
(45) Date of Patent: Nov. 5, 2013

(54) POWER CONTROL SYSTEM AND METHOD

(75) Inventors: Russel J. Kerkman, Milwaukee, WI (US); Carlos D. Rodriguez-Valdez, Glendale, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 764 days.

(21) Appl. No.: 12/706,488

(22) Filed: Feb. 16, 2010

(65) Prior Publication Data

US 2011/0199072 A1   Aug. 18, 2011

(51) Int. Cl.
*G01R 25/00* (2006.01)
*H03L 7/06* (2006.01)

(52) U.S. Cl.
USPC ........................................ 324/76.77; 327/156

(58) Field of Classification Search
USPC .............. 324/76.77, 76.11, 66; 327/156, 155, 327/141, 100
See application file for complete search history.

(56) References Cited

U.S. PATENT DOCUMENTS

| | | | | |
|---|---|---|---|---|
| 3,875,553 A | * | 4/1975 | Formica et al. | 331/116 R |
| 4,208,687 A | * | 6/1980 | Sun et al. | 361/20 |
| 4,218,718 A | * | 8/1980 | Sun | 361/79 |
| 4,313,209 A | * | 1/1982 | Drucker | 455/112 |
| 6,052,297 A | * | 4/2000 | Akamatsu et al. | 363/84 |
| 6,977,827 B2 | * | 12/2005 | Gritter | 363/40 |
| 7,180,940 B2 | * | 2/2007 | Li et al. | 375/232 |
| 2005/0231871 A1 | * | 10/2005 | Karimi Ghartemani | 361/86 |
| 2009/0244937 A1 | * | 10/2009 | Liu | 363/46 |

* cited by examiner

*Primary Examiner* — Hoai-An D Nguyen
(74) *Attorney, Agent, or Firm* — Fletcher Yoder, P.C.; Alexander R. Kiszewski; John M. Miller

(57) ABSTRACT

A system and method for controlling an electrical device is provided. The method includes receiving three phase power from a source, decomposing signals representative of power in each phase of the three phase power to provide a positive-sequence component of each phase and tracking the positive-sequence component of each phase via a phase locked loop and a tracking filter.

20 Claims, 4 Drawing Sheets

POWER CONTROL SYSTEM AND METHOD

BACKGROUND

The invention relates to power systems and more specifically to a system and method for controlling power.

Electric sources may be connected or organized in a network to enable the transmission of power to various devices, or communication between the devices. Such a network of interconnected devices may be described as a grid. For example, a power grid may be an interconnected network for delivering electricity from one or more power generators to the connected devices (e.g., customers of the utility company). A power grid may transmit AC power at a frequency, amplitude, and/or phase angle to a large number of electrical devices. Synchronized operation of a grid, or portions of a grid, may enable a pooling of power generation, as well as a pooling of loads to result in lower operating costs.

Though transmitting synchronized AC power may be beneficial to the efficient transmission and/or distribution of power, many factors may disturb the synchronization of a grid. For example, a power grid including an unbalanced power source may disturb the synchronization of the grid.

Typically, phase lock loops (PLLs) are used in power systems for synchronization. PLLs under balanced conditions generate a signal that has a fixed relation to the phase of an input signal. PLLs respond to both the frequency and the phase of the input signals, automatically raising or lowering the frequency of a controlled oscillator until it is matched to the reference in both frequency and phase. However, PLLs have limited success when employed in grids having unbalanced power sources.

Therefore there is a need to implement a control system that synchronizes the input power signals to the grid output signals.

BRIEF DESCRIPTION

Briefly, according to one embodiment of the invention, a method for controlling an electrical device is provided. The method comprises receiving three phase power from a source, decomposing signals representative of power in each phase of the three phase power to provide a positive-sequence component of each phase, and tracking the positive-sequence component of each phase via a phase locked loop and a tracking filter.

In another embodiment, a method for controlling an electrical device is provided. The method comprises receiving three phase power from a source, applying the three phase power to a tracking filter to generate balanced quadrature signals representative of each phase of power, decomposing the quadrature signals to obtain a positive-sequence component of each phase of power, applying the positive-sequence components to a phase locked loop to generate signals for each phase representative of rotational frequency or speed, and applying the signals representative of rotational frequency or speed to the tracking filter to track the positive-sequence components.

In another embodiment, a system for controlling an electrical device is provided. The system comprises a tracking filter device configured to determine quadrature signals representative of each phase of three phase power from a source, and a decomposition circuit configured to decompose the quadrature signals to obtain a positive-sequence component of each phase of power. The system further includes a phase locked loop coupled to receive the positive-sequence components and configured to generate signals for each phase representative of rotational frequency or speed, the signals representative of rotational frequency or speed being applied to the tracking filter to track the positive-sequence components.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
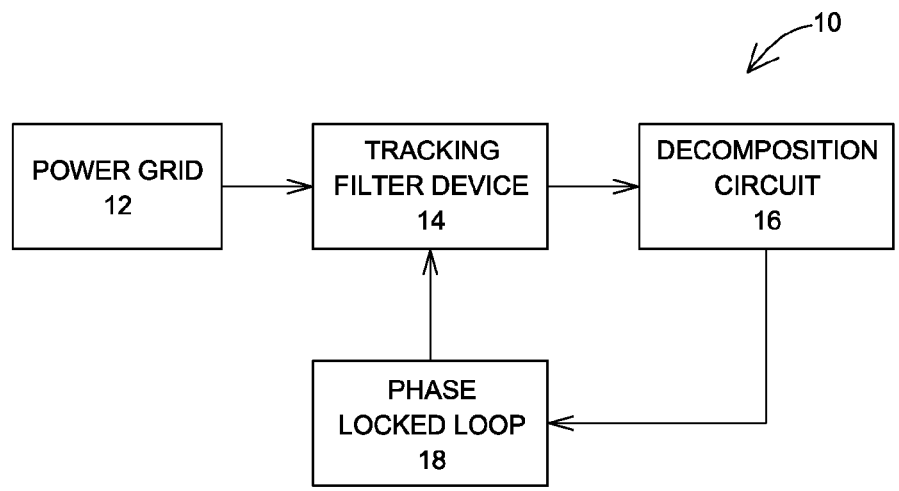
FIG. 1 is a block diagram of an embodiment of a power control system implemented according to one aspect of the invention.

Turning now to the drawings, and referring first to FIG. 1, a power system is illustrated. Power system 10 comprises a power grid 12, a tracking filter device 14, a decomposition network 16 and a phase locked loop (PLL) 18. Each block is described in further detail below.

Power grid 12 is configured to provide three phase power to various electrical loads (not shown). Power generated and distributed by various sources (e.g., a power plant, a generator, etc.) may be synchronized in frequency, amplitude, and/or phase angle. Synchronization of AC power results in the efficient transmission and/or distribution of power. Power from the grid may be applied to the downstream circuitry discussed below by any suitable components, such as transformers, power lines, in-plant power distribution equipment and buses, and so forth. Moreover, the grid-side components may include certain upstream switchgear and protection devices, such as disconnects, fuses, and so forth (not separately represented).

Tracking filter device 14 is configured to receive each phase of three phase power from the power grid and to convert the signals into balanced quadrature signals. In one embodiment, the tracking filter device 14 includes three tracking filters configured for tracking positive-sequence components of each of the phase. The tracking filter device itself may be of a type described in U.S. patent application Ser. No. 12/627,400, entitled "Digital Implementation of a Tracking Filter", and filed on Nov. 30, 2009 and Ser. No. 12/627,472, entitled "A Phase Locked Loop with Tracking Filter for Synchronizing an Electric Grid", filed on Nov. 30, 2009 both of which are incorporated herein in their entirety.

Decomposition circuit 16 is configured to decompose the balanced quadrature signals to symmetric components. The symmetric components include a positive-sequence component and a negative component of each phase of power. In one embodiment, the positive-sequence components of the phases are substantially similar but displaced by 120 degrees from one another.

PLL 18 receives the positive-sequence components generated by the decomposition circuit 16. PLL 18 is configured to generate signals for each phase representative of rotational frequency or speed (the rotational speed being a function of the electrical frequency). The signals representative of rotational frequency or speed is applied to the tracking filter to track the positive-sequence component of the input signals. In one embodiment, the PLL is synchronized with a positive-sequence of the source. The manner in which the symmetric components are generated is described in further detail below.

Figure 2:
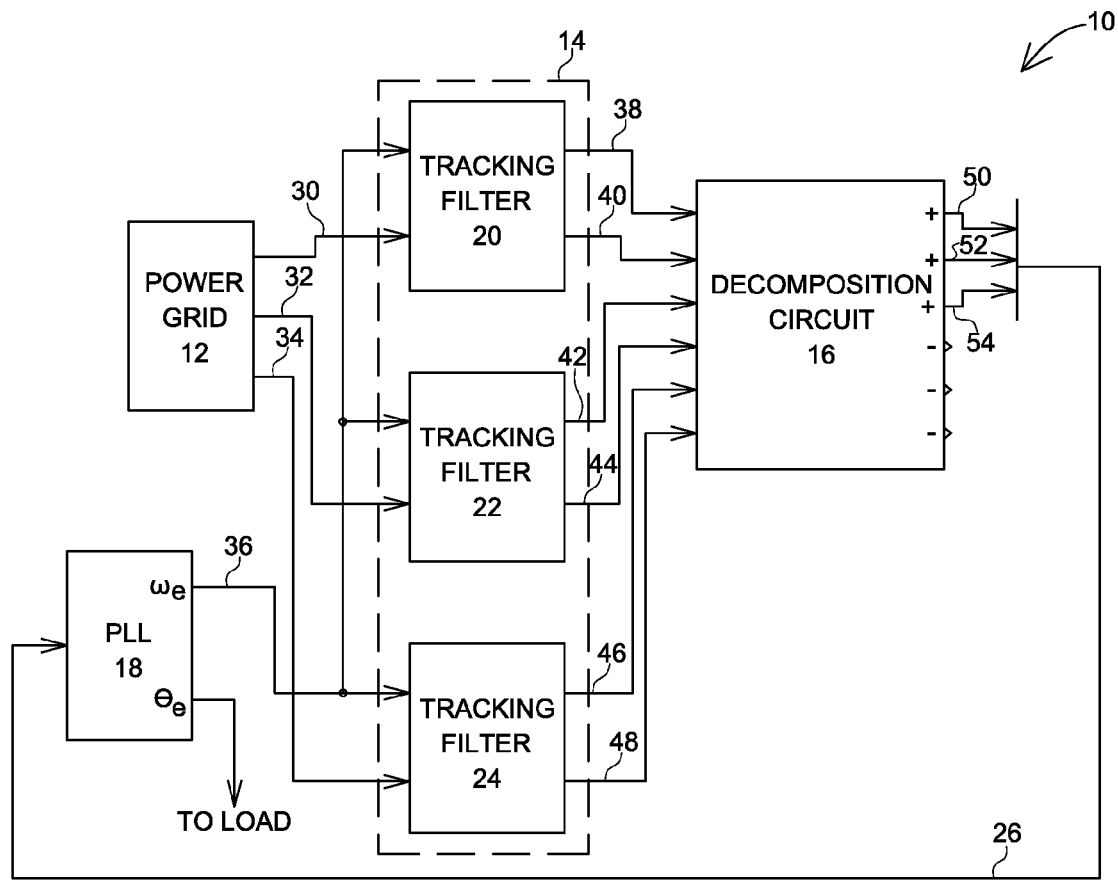
FIG. 2 is a block diagram illustrating the components of a tracking filter device used in a power system according to one embodiment of the invention.

FIG. 2 is a block diagram illustrating the components of a tracking filter device used in a power system according to one embodiment of the invention. The tracking filter device includes three tracking filters 20, 22 and 24 respectively. Each block is described in further detail below.

The tracking filter device is configured to receive each phase of three phase power generated by an AC power source in the power grid 12. Specifically, tracking filter 20 is configured to receive "phase A" of the three phase power and is represented by reference numeral 30. Similarly, tracking filter 22 is configured to receive "phase B" of the three phase power and is represented by reference numeral 32, and tracking filter 24 is configured to receiving "phase C" of the three phase power and is represented by reference numeral 34.

Tracking filter 20 is configured to generate balanced quadrature signals represented by reference numerals 38 and 40. Similarly, tracking filter 22 is configured to generate balanced signals represented by reference numerals 42 and 44, and tracking filter 24 is configured to generate balanced signals represented by reference numerals 46 and 48. In one embodiment, the tracking filters are non-linear. The quadrature signals $x_1$ and $x_2$ generated by tracking filter 20 (and/or tracking filters 22 and 24) may be represented by the following state-space equation:

$$\begin{bmatrix} \dot{x}_1 \\ \dot{x}_2 \end{bmatrix} = \begin{bmatrix} -a & -\omega_0 \\ \omega_0 & 0 \end{bmatrix} * \begin{bmatrix} x_1 \\ x_2 \end{bmatrix} + \begin{bmatrix} a \\ 0 \end{bmatrix} * u \quad \text{Equation (1)}$$

where "$\omega_0$" represents an angular frequency of the input signal and "a"=is a constant parameter associated to bandwidth.

The balanced quadrature signals generated by tracking filters 20, 22 and 24 are applied to decomposition circuit 16. The decomposition circuit 16 decomposes each set of quadrature signals into corresponding positive-sequence components and negative-sequence components. The positive-sequence components of the three phases $f_{a1}$, $f_{b1}$ and $f_{c1}$ (as indicated by reference numbers 50, 52, and 54) may be represented by the following equation:

$$\begin{bmatrix} f_{a1} \\ f_{b1} \\ f_{c1} \end{bmatrix} = \quad \text{Equation (2)}$$

$$\frac{1}{3} \left\{ \begin{bmatrix} 1 & -\frac{1}{2} & -\frac{1}{2} \\ -\frac{1}{2} & 1 & -\frac{1}{2} \\ -\frac{1}{2} & -\frac{1}{2} & 1 \end{bmatrix} + j \begin{bmatrix} 0 & \frac{\sqrt{3}}{2} & -\frac{\sqrt{3}}{2} \\ -\frac{\sqrt{3}}{2} & 0 & \frac{\sqrt{3}}{2} \\ \frac{\sqrt{3}}{2} & -\frac{\sqrt{3}}{2} & 0 \end{bmatrix} \right\} \begin{bmatrix} f_a \\ f_b \\ f_c \end{bmatrix}$$

where $f_a$, $f_b$ and $f_c$ can be current, voltage, flux linkage or similar of the signals in phases A, B and C respectively. The output signal 26 of the decomposition circuit 16 is provided to PLL 18. PLL 18 is configured to generate signals for each tracking filter representative of rotational frequency or speed. The signals 36 representative of electrical frequency or electrical angular speed "$\omega_e$" is applied to each tracking filter 20, 22 and 24 as input $\omega_0$ to track the positive-sequence components. Thus, even if a voltage unbalance exists in a power grid, the PLL is synchronized with a positive-sequence component set of the power signals.

Figure 3:
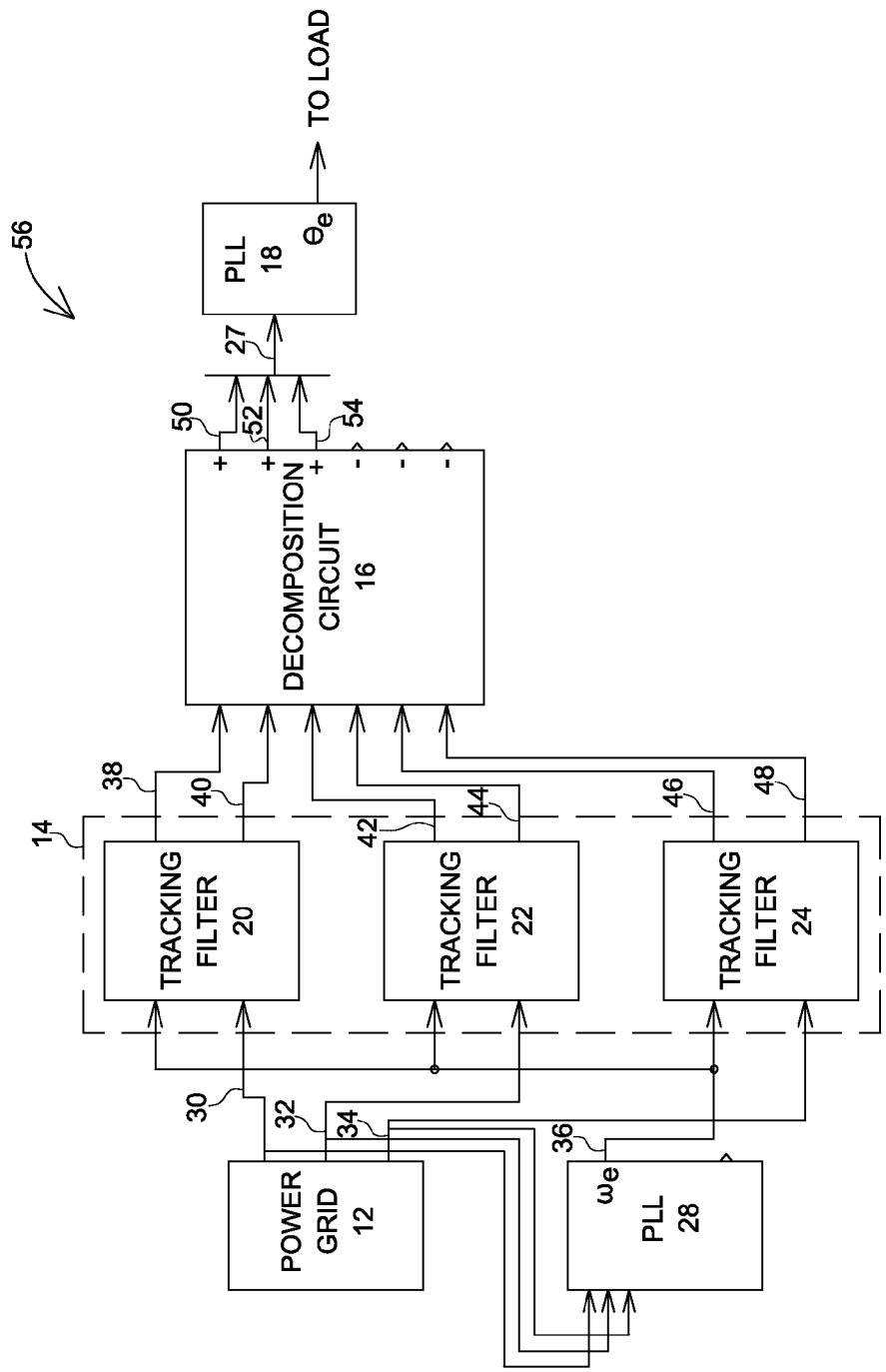
FIG. 3 is a block diagram of another embodiment of a power control system implemented according to an aspect of the invention.

In another embodiment of the power control system, PLL 18 is used to compute the phase angle "$\theta_e$" of the positive sequence components. FIG. 3 is a block diagram of another embodiment of power control system 58 including a first PLL 18 and a second PLL 28. PLL 18 is used to generate signals representative of the phase angle "$\theta_e$" of the positive sequence components. The output signal 27 of PLL 18 is provided to a load (for example, a power converter) coupled to the power control system.

Figure 4:
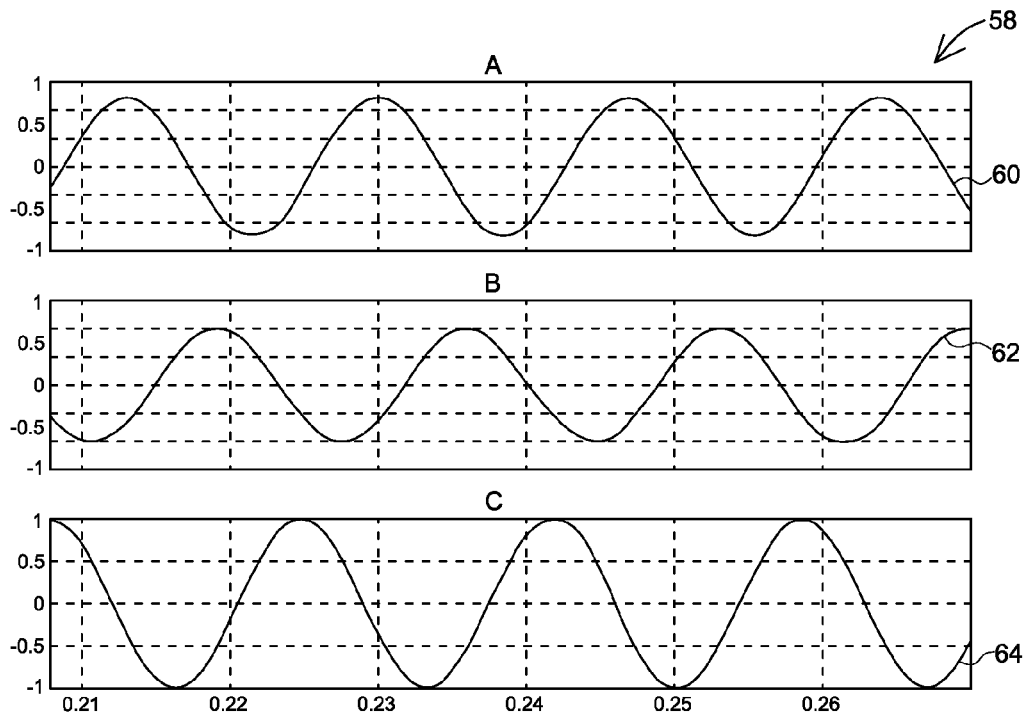
FIG. 4 is a graph illustrating current unbalance in an power grid current having three phases.

PLL 28 receives three phase power from power grid 12 and is configured to generate signals "$\omega_e$" for each tracking filter representative of rotational frequency or speed. PLL 28 is similar to the phase locked loop device disclosed in U.S. patent application Ser. No. 12/527,472, entitled "A phase locked loop with tracking filter for synchronizing an electric grid", filed on 30 Dec. 2009. The embodiment discussed above has a substantially improved dynamic response. FIG. 4 is a graph depicting current unbalance in a power grid current having three phases. Graph 58 depicts unbalanced input currents 60, 62 and 64 in phase A, phase B and phase C respectively. It may be noted that the unbalanced currents may behave similarly to unbalanced voltages. The graph 58 shows the three-phases of the current vectors in the time domain.

Figure 5:
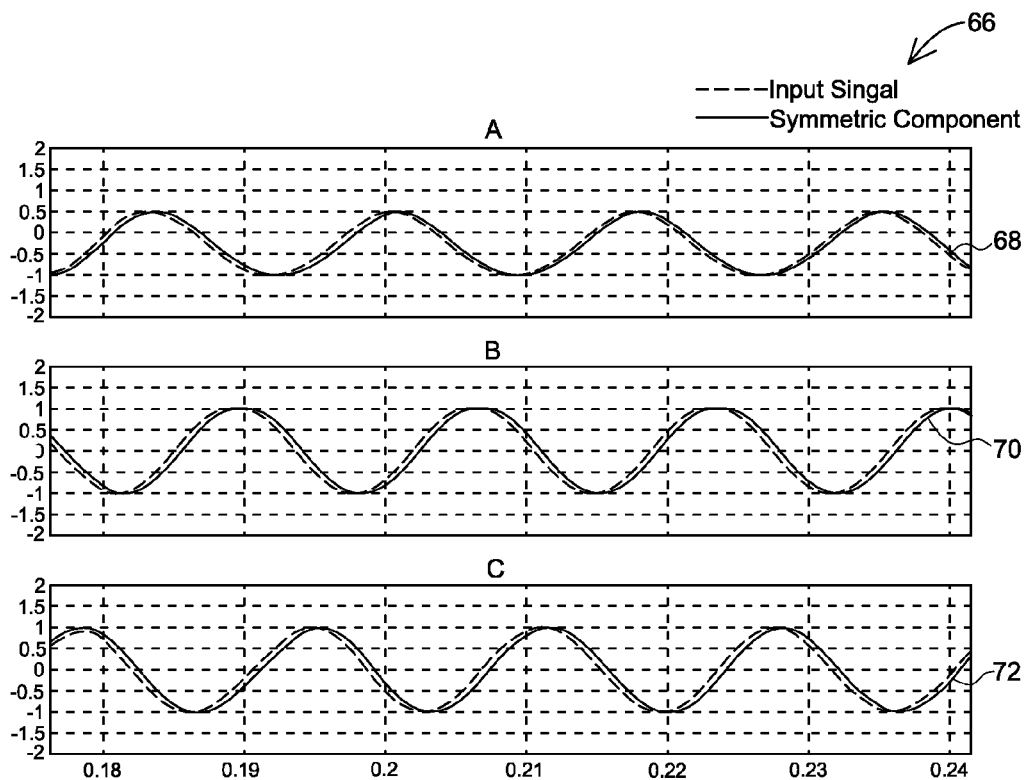
FIG. 5 is a graph illustrating positive-sequence components derived from unbalance input current.

FIG. 5 is a graph depicting symmetric components generated by the decomposition circuit. Graph 66 depicts symmetric components 68, 70 and 72 synchronized with a positive-sequence set of the current from the source in phase A, B and C respectively. The PLL is configured to synchronize the symmetric components generated by the decomposition circuit with the positive-sequence set of the input current.

Figure 6:
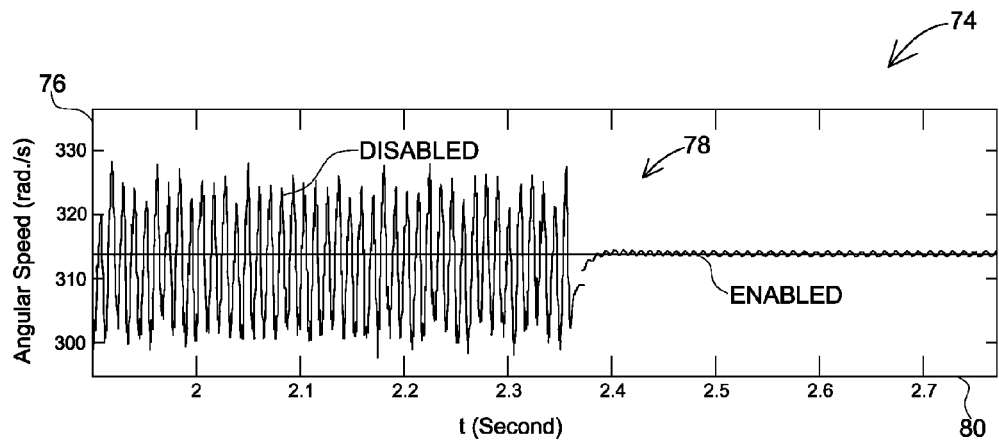
FIG. 6 is a graph depicting the effect of applying the present techniques to synchronize the grid having unbalanced power.

FIG. 6 is a graph depicting the effect of applying the present techniques to synchronize the grid having unbalanced power. The graph 74 depicts the output angular frequency 76 of a PLL over time 80. As seen in the graph 74, the output estimate 78 may fluctuate substantially in the portion of the graph marked "disabled," which is approximately from 0 to 2.36 seconds. Once a PLL using a decomposition network is enabled, the output estimate 78 fluctuate less, as shown in the portion of the graph marked "enabled," which is approximately from 2.36 to 2.75 seconds. The remaining fluctuations may result from other harmonics which are outside the bandwidth of the tracking filter.

Figure 7:
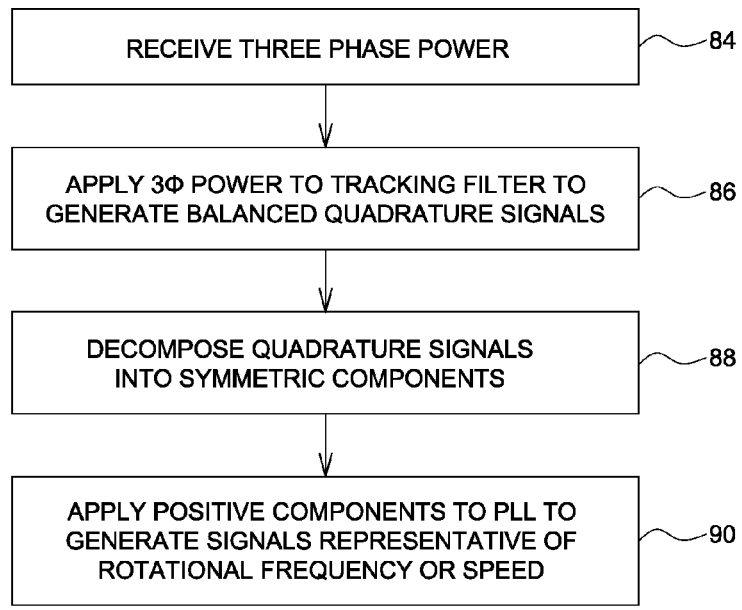
FIG. 7 is a flow chart illustrating one method by which an electrical device is controlled.

FIG. 7 is a flow chart illustrating one method by an electrical system is controlled. At step 84, a three phase power from a source. The three phase power may be supplied to various electrical devices using a power grid.

At step 86, the three phase power is applied to a tracking filter to generate balanced quadrature signals representative of each phase of power. In one embodiment, the balanced quadrature signals are generated via a separate tracking filter for each of the three phases.

At step 88, the balanced quadrature signals are decomposed to obtain symmetric components for each phase. The symmetric components include positive-sequence components and negative-sequence components. In one embodiment, the positive-sequence components of the phases are substantially similar but displaced by 120 degrees from one another. In a further embodiment, the balanced quadrature signals are decomposed to obtain a negative component for each phase of power.

At step 90, the positive-sequence components are applied to a phase locked loop to generate signals for each phase representative of rotational frequency or speed. The signals representative of rotational frequency or speed are then applied to the tracking filter to track the positive-sequence components. In one embodiment, the PLL is synchronized with a positive-sequence set of the source.

The above described techniques have many advantages including providing synchronization to power grid for standalone system drives and distributed generation sources. The technique provides a high dynamic solution to substantially reduce 'dirty' grid synchronization problems.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for controlling an electrical device, comprising:
   receiving three phase power from a source;
   decomposing signals representative of power in each phase of the three phase power to provide a positive-sequence component of each phase; and
   tracking the positive-sequence component of each phase via a phase locked loop and a tracking filter.

2. The method of claim 1, wherein the positive-sequence components of the phases are substantially similar but displaced by 120 degrees from one another.

3. The method of claim 1, wherein the phase locked loop provides a rotational frequency or speed signal to the tracking filter.

4. The method of claim 1, wherein the positive-sequence components are tracked via a separate tracking filter for each of the phases.

5. The method of claim 1, wherein the decomposing signals representative of power in each phase comprise generating balanced quadrature signals.

6. The method of claim 5, further comprising decomposing signals representative of power in each phase of the three phase power to provide a negative component of each phase.

7. The method of claim 1, wherein the phase locked loop provides a phase angle signal.

8. A method for controlling an electrical device, comprising:
   receiving three phase power from a source;
   applying the three phase power to a tracking filter to generate balanced quadrature signals representative of each phase of power;
   decomposing the quadrature signals to obtain a positive-sequence component of each phase of power;
   applying the positive-sequence components to a phase locked loop to generate signals for each phase representative of rotational frequency or speed; and
   applying the signals representative of rotational frequency or speed to the tracking filter to track the positive-sequence components.

9. The method of claim 8, wherein the positive-sequence components are tracked via a separate tracking filter for each of the phases.

10. The method of claim 8, wherein the three phase power is received from an unbalanced power source.

11. The method of claim 8, further comprising decomposing the quadrature signals to obtain a negative component of each phase of power.

12. The method of claim 8, wherein the positive-sequence components of the phases are substantially similar but displaced by 120 degrees from one another.

13. A system for controlling an electrical device, comprising:
   tracking filter device configured to determine quadrature signals representative of each phase of three phase power from a source;
   a decomposition circuit configured to decompose the quadrature signals to obtain a positive-sequence component of each phase of power; and
   a phase locked loop coupled to receive the positive-sequence components and configured to generate signals for each phase representative of rotational frequency or speed, the signals representative of rotational frequency or speed being applied to the tracking filter to track the positive-sequence components.

14. The system of claim 13, wherein the positive-sequence components of the phases are substantially similar but displaced by 120 degrees from one another.

15. The system of claim 13, wherein the phase locked loop is synchronized with a positive-sequence set of the source.

16. The system of claim 13, wherein the tracking filter device comprises three tracking filters configured for tracking positive-sequence components of each of the phase.

17. The system of claim 13, wherein the decomposition circuit is further configured to decompose the quadrature signals to obtain a negative component of each phase of power.

18. The system of claim 13, further comprising a power grid configured to provide three phase power to the tracking filter.

19. A system for controlling an electrical device, comprising:
   non-linear tracking filter device configured to determine quadrature signals representative of each phase of three phase power from a source;
   a decomposition circuit configured to decompose the quadrature signals to obtain a positive-sequence component of each phase of power; and
   a first phase locked loop coupled to receive the positive-sequence components and configured to generate signals for each phase representative of phase angle.

20. The system of claim 19, further comprising a second phase locked loop coupled to receive three phase power from a source and generate signals representative of a rotational frequency or speed, the signals representative of rotational frequency or speed being applied to the tracking filter to track the positive-sequence components.

* * * * *